(12) United States Patent
Musha et al.

(10) Patent No.: US 8,366,375 B2
(45) Date of Patent: Feb. 5, 2013

(54) ROTATION INTRODUCTION MECHANISM, SUBSTRATE TRANSFER APPARATUS, AND VACUUM PROCESSING APPARATUS

(75) Inventors: Kazuhiro Musha, Kanagawa (JP); Hirofumi Minami, Kanagawa (JP); Takafumi Kawaguchi, Kanagawa (JP)

(73) Assignee: ULVAC, Inc., Kanagawa (JP)

( * ) Notice: Subject to any disclaimer, the term of this patent is extended or adjusted under 35 U.S.C. 154(b) by 543 days.

(21) Appl. No.: 12/513,873

(22) PCT Filed: Nov. 13, 2007

(86) PCT No.: PCT/JP2007/071966
§ 371 (c)(1),
(2), (4) Date: Jun. 4, 2009

(87) PCT Pub. No.: WO2008/059815
PCT Pub. Date: May 22, 2008

(65) Prior Publication Data
US 2010/0135751 A1 Jun. 3, 2010

(30) Foreign Application Priority Data
Nov. 14, 2006 (JP) ................. 2006-307605

(51) Int. Cl.
*H01L 21/677* (2006.01)
(52) U.S. Cl. .................... 414/744.5; 414/917
(58) Field of Classification Search ........... 414/744.5, 414/744.1, 744.2, 917; 277/572
See application file for complete search history.

(56) References Cited

U.S. PATENT DOCUMENTS

| 5,151,008 A * | 9/1992 | Ishida et al. | 414/744.5 |
| 5,950,495 A * | 9/1999 | Ogawa et al. | 74/490.01 |
| 6,364,599 B1 * | 4/2002 | Suwa et al. | 414/744.1 |
| 6,764,271 B2 * | 7/2004 | Momoki | 414/744.5 |

FOREIGN PATENT DOCUMENTS

| JP | 47-9005 | 3/1972 |
| JP | 04-030447 | 2/1992 |
| JP | 05-044852 | 2/1993 |
| JP | 09-012013 | 1/1997 |
| JP | 2000-150614 | 5/2000 |
| JP | 2004-237436 | 8/2004 |

OTHER PUBLICATIONS

International Search Report for PCT Patent App. No. PCT/JP2007/071966 (Feb. 19, 2008).

* cited by examiner

*Primary Examiner* — Scott Lowe
(74) *Attorney, Agent, or Firm* — Cermak Nakajima LLP; Tomoko Nakajima

(57) ABSTRACT

There are provided a rotation introduction mechanism which transmits a rotating motion on the atmosphere side into vacuum, is arranged simply, has a low sliding resistance, and has a long life, a substrate transfer apparatus, a substrate transfer apparatus having a small pivot radius and generating a smaller amount of dusts, and a vacuum processing apparatus. A lubricant holding member is attached to a vacuum seal mechanism. The substrate transfer apparatus is arranged such that a first link mechanism includes a first arm and a fourth arm, a second link mechanism includes a second arm and a third arm, the first arm is fixedly attached to a first drive shaft, the first arm is fixedly attached to a second drive shaft, the third arm is rotatably attached to the first drive shaft, and the fourth arm is rotatably attached to the second drive shaft. The vacuum processing apparatus includes the substrate transfer apparatus.

13 Claims, 5 Drawing Sheets

ROTATION INTRODUCTION MECHANISM, SUBSTRATE TRANSFER APPARATUS, AND VACUUM PROCESSING APPARATUS

This application is a national phase entry under 35 U.S.C. §371 of PCT Patent Application No. PCT/JP2007/071966, filed on Nov. 13, 2007, which claims priority under 35 U.S.C. §119 to Japanese Patent Application Nos. 2006-307605, filed Nov. 14, 2006, all of which is incorporated by reference.

FIELD OF THE INVENTION

The present invention relates to a rotation introduction mechanism, a substrate transfer apparatus, and vacuum processing apparatus, and more particularly to a rotation introduction mechanism for transmitting a rotating motion on the atmosphere side into vacuum, a substrate transfer apparatus for transferring an object to be processed such as a substrate and the like to a predetermined position, and a vacuum processing apparatus including the substrate transfer apparatus.

BACKGROUND ART

A semiconductor device manufacturing apparatus has an airtight structure because the inside of the apparatus, in which a substrate as an object to be processed is processed, must be maintained in vacuum or in a strictly controlled gas atmosphere. Accordingly, a transfer apparatus for transferring a substrate as an object to be processed in a processing apparatus must save a space as far as possible and is required to have a mechanism that generates dusts, worn powder, an out gas (discharged gas), and the like in an amount as small as possible. This is because the dusts, the worn powder, and the like deposit on a substrate to be processed as particles (foreign substances) and is mixed with a thin film formed on a substrate surface as particles (foreign substances). Further, since an increase of a maintenance period of a substrate transfer apparatus and a vacuum processing apparatus increases a number of substrates to be processed from a view point of a manufacturing step, it is strongly required to increase a life of the apparatuses and to increase a life of a vacuum seal portion.

There is known a transfer apparatus capable of performing a transfer job of a substrate such as a semiconductor wafer and the like, in, for example, a processing apparatus without reciprocatingly moving a transfer arm repeatedly as a conventional substrate transfer apparatus (see Patent Document 1).

Patent Document 1: JP-A-1992(Hei4)-30447 (see, e.g., claims)

DISCLOSURE OF THE INVENTION

Problems to be Solved by the Invention

Although Japanese Patent Application Laid-Open Publication No. 1992(Hei4)-30447 uses a magnetic fluid seal, an oil seal, and an O-ring as a rotation introduction mechanism, the magnetic fluid seal is expensive. As the rotation introduction mechanism of a vacuum transfer apparatus, there is a Wilson seal mechanism as a relatively simple system as shown in FIG. 5 in addition to the seal means. The seal mechanism is advantageous in that it has a low sliding resistance in comparison with other solid contact type seal mechanisms. However, since the seal mechanism has a problem in generation of dusts, heat generation, a short lubricant life, and the like, a rotation introduction mechanism, which is more clean and has a longer life, is required. In FIG. 5, reference numeral 61 denotes a rotating shaft, 62 denotes a lubricant, 63 denotes an elastomer sheet for holding the lubricant, and 64 denotes an O-ring.

Further, since the substrate transfer apparatus disclosed in Japanese Patent Application Laid-Open Publication No. 1992 (Hei4)-30774 has no substrate lifting/lowering mechanism and further a first parallel link and a second parallel link each composed of a pair of arms are independently coupled with two drive shafts and two driven shafts, that is, with four shafts in total, the apparatus has a problem in that a total weight and a manufacturing cost thereof are increased. Furthermore, since the four shafts, that is, the two drive shafts and the two driven shafts are disposed at intervals, the substrate transfer apparatus is disadvantageous also in that the apparatus itself cannot be made compact because a rotation radius is increased.

A subject of the present invention, which was made to solve the problems of the conventional technique, is to provide a rotation introduction mechanism, which does not require a complex arrangement, has a low sliding resistance, generates dusts in a smaller amount, and has a long lubricant life, and is to provide a substrate transfer apparatus, which has a small rotation radius achieved by saving a space and whose total weight and manufacturing cost are reduced, and is to provide a vacuum processing apparatus including the substrate transfer apparatus.

Means for Solving the Problems

In order to solve the above problems, a rotation introduction mechanism for transmitting a rotating motion of a drive source installed on the atmosphere side into vacuum in an exemplary embodiment according to the disclosure includes a vacuum seal mechanism including a lip portion, a lubricant and a lubricant holding member. The lip portion is formed to reduce a contact area between the lip portion and a rotating shaft.

According to the rotation introduction mechanism in an exemplary embodiment of the disclosure, the lip portion is formed so that the cross section of a part of the lip portion, which is in contact with the rotating shaft, is formed so as to be in line contact therewith in the vacuum seal mechanism.

According to the rotation introduction mechanism in an exemplary embodiment of the disclosure, the vacuum seal mechanism further includes a presser member for pressing the lip portion to the rotating shaft.

A substrate transfer apparatus according to an exemplary embodiment of the disclosure includes a first link mechanism including a first arm and a fourth arm; and a second link mechanism including a second arm and a third arm. The first arm is fixedly attached to a first drive shaft, and the second arm is fixedly attached to a second drive shaft. The third arm is rotatably attached to the first drive shaft, and the fourth arm is rotatably attached to the second drive shaft.

In an exemplary embodiment according to the disclosure in the substrate transfer apparatus, the first link mechanism includes a first parallel link and a third parallel link, the second link mechanism includes a second parallel link and a fourth parallel link, the first parallel link includes the first arm and the fourth arm, and the second parallel link includes the second arm and the third arm.

In an exemplary embodiment according to the disclosure, the substrate transfer apparatus further includes a case in which a drive source is accommodated; and a protection member for protecting the drive source to prevent a component of the drive source or internal structural members of the case from being deformed by a force applied from outside to the internal structural members. The internal structural members are disposed asymmetrically to a center axis of the case, and a member having large rigidity is used as the protection member.

In an exemplary embodiment according to the disclosure, the substrate transfer apparatus further includes a vertically moving mechanism for moving the first link mechanism and the second link mechanism in a vertical direction.

A substrate transfer apparatus according to an exemplary embodiment of the disclosure includes a first link mechanism including a first arm and a fourth arm; a second link mechanism including a second arm and a third arm, wherein, the first arm is fixedly attached to a first drive shaft, the second arm is fixedly attached to a second drive shaft, the third arm is rotatably attached to the first drive shaft, and the fourth arm is rotatably attached to the second drive shaft; and the rotation introduction mechanism disposed as a rotation introduction mechanism for transmitting a rotating motion of a drive source installed on atmosphere side into vacuum through the first drive shaft and the second drive shaft.

In an exemplary embodiment according to the disclosure in the substrate transfer apparatus, the first link mechanism includes a first parallel link and a third parallel link, the second link mechanism includes a second parallel link and a fourth parallel link, the first parallel link includes the first arm and the fourth arm, and the second parallel link includes the second arm and the third arm.

In an exemplary embodiment according to the disclosure, the substrate transfer apparatus further includes a case in which a drive source is accommodated; and a protection member for protecting the drive source to prevent a component of the drive source or internal structural members of the case from being deformed by a force applied from outside to the internal structural members. The internal structural members are disposed asymmetrically to a center axis of the case, and a member having large rigidity is used as the protection member.

In an exemplary embodiment according to the disclosure, the substrate transfer apparatus further includes a vertically moving mechanism for moving the first link mechanism and the second link mechanism in a vertical direction.

A substrate transfer apparatus according to an exemplary embodiment of the disclosure includes a first link mechanism including a first parallel link and a third parallel link; a second link mechanism including a second parallel link and a fourth parallel link, wherein the first parallel link has a first arm and a fourth arm, the second parallel link has a second arm and a third arm, the first arm is fixedly attached to a first drive shaft, the second arm is fixedly attached to a second drive shaft, the third arm is rotatably attached to the first drive shaft, the fourth arm is rotatably attached to the second drive shaft, and wherein rotation of the first parallel link rotated by the first drive shaft is transmitted to the third parallel link through a gear to thereby rotate the third parallel link in a direction reverse to that of the first parallel link; a substrate holding portion disposed to an extreme end of the third parallel link movable linearly on a linear line that connects the first drive shaft to the second drive shaft, wherein rotation of the second parallel link rotated by the second drive shaft is transmitted to the fourth parallel link through a gear to thereby rotate the fourth parallel link in a direction reverse to that of the second parallel link; and a substrate holding portion disposed to an extreme end of the fourth parallel link movable linearly on a linear line that connects the first drive shaft to the second drive shaft.

In an exemplary embodiment according to the disclosure, the substrate transfer apparatus further includes a case in which a drive source is accommodated; and a protection member for protecting the drive source to prevent a component of the drive source or internal structural members of the case from being deformed by a force applied from outside to the internal structural members. The internal structural members are disposed asymmetrically to a center axis of the case, and a member having large rigidity is used as the protection member.

In an exemplary embodiment according to the disclosure, the substrate transfer apparatus further includes a vertically moving mechanism for moving the first link mechanism and the second link mechanism in a vertical direction.

In an exemplary embodiment according to the disclosure, the substrate transfer apparatus further includes the rotation introduction mechanism. The rotation introduction mechanism is disposed to each of the first drive shaft and second drive shaft as a rotation introduction mechanism for transmitting a rotating motion of the drive source installed on atmosphere side into vacuum through the first drive shaft and the second drive shaft.

A vacuum processing apparatus according to an exemplary embodiment of the disclosure includes a transfer chamber having the substrate transfer apparatus; and at least one vacuum processing chamber coupled with the transfer chamber and arranged to transfer an object to be processed using the substrate transfer apparatus.

Effect of the Invention

According to the rotation introduction mechanism of the present invention, a lubricant filling cycle is made long because the rotation introduction mechanism is filled with a lubricant in a large amount, worn powder is generated in a smaller amount and a clean environment is secured because a sliding resistance is low due to the small contact area of the lip portion with the rotating shaft. Accordingly, there can be achieved effects in that worn powder is generated in a smaller amount and a clean environment is secured as well as a life is long and an improvement of a processing efficiency of an object to be processed placed on the vacuum side can be expected.

According to the substrate transfer apparatus of the present invention, there can be achieved effects in that a number of components can be reduced and a total weight and a manufacturing cost of the substrate transfer apparatus can be reduced because a driven shaft is omitted by sharing the attachment shaft of the first parallel link and the second parallel link in the parallel link mechanism. Further, when the substrate transfer apparatus is compared with a conventional substrate transfer apparatus, in which four shafts in total of drive shafts and driven shafts are disposed at intervals, there can be achieved effects in that a space can be saved because a pivot radius can be reduced by the intervals by sharing the attachment shafts.

According to the vacuum processing apparatus of the present invention, since the substrate transfer apparatus is used, there can be achieved effects in that a processing time of objects to be processed can be reduced as well as no particle (foreign substance) is deposited on the objects to be processed because the objects to be processed can be sequentially and continuously loaded to and unloaded from a predetermined position of a vacuum processing chamber in one step and a working time can be also reduced.

BEST MODE FOR CARRYING OUT THE INVENTION

An embodiment of the present invention will be explained below referring to the accompanying drawings.

According to an embodiment of a rotation introduction mechanism of the present invention, there is provided as shown in FIG. 1 a rotation introduction mechanism S having, as a vacuum seal mechanism, a lip portion 2, a presser member 3 such as a spring and the like, which is attached to the lip portion 2 and achieves a vacuum seal by pressing a part of the lip portion to a rotating shaft, a lubricant 4 for the lip portion 2, a lubricant holding member 5 for holding the lubricant 4, and fixing members 6 for fixing the lip portion in a rotation introduction mechanism for transmitting a rotating motion of a drive source such as a drive motor and the like disposed on the atmosphere side A to a structure (not shown) to be rotated which is disposed on a vacuum side B through a drive shaft (rotating shaft) 1.

A shape of the lip portion 2 is not particularly restricted, and the lip portion 2 is formed in such a shape by which a contact area of the lip portion 2 with the rotating shaft 1 is reduced, for example, in such a shape by which the cross section of a part of the lip portion 2, which is in contact with the rotating shaft 1, is in line contact with it so that the rotating shaft 1 is vacuum sealed by the lip portion 2. Since one end of the lip portion 2 comes into contact with or is dipped in the lubricant 4, the lubricant is supplied to the lip portion, and thus a lubrication performance of the vacuum seal mechanism is kept. The lubricant holding member 5 is fixed to the rotating shaft 1 and rotated together with it. The lubricant holding member 5 is preferably fixed to the rotating shaft 1 using an O ring 8 and the like to prevent leakage of the lubricant 4. The fixing members 6 are fixed to a housing 7.

The lip portion 2 is made of elastomer, for example, natural rubber, synthetic rubber, elastic plastic, and the like. Further, it is sufficient that the fixing members 6 securely fix the lip portion 2 and keep airtightness to the housing 7, and the fixing members 6 may be made of metal and the like. When the fixing members 6 are made of metal, a lubricant similar to the lubricant 4 is preferably coated and attached between the fixing members 6 and the housing 7 to increase airtightness.

Although the Wilson seal mechanism shown in FIG. 5 is used as a relatively simple system in rotation introduction mechanism which is conventionally used in a vacuum transfer apparatus, the Wilson seal mechanism has a problem in that it generates dusts and heat and has a short lubrication life although it is advantageous in that it has a low sliding resistance as compared with other solid contact type seal mechanisms. The rotation introduction mechanism S of the present invention is advantageous that it has a long lubricant filling cycle in comparison with the Wilson seal mechanism because it can be filled with a large amount of the lubricant 4 due to the lubricant holding member 5 attached thereto. The rotation introduction mechanism S of the present invention is also advantageous in that it has a low sliding resistance because the contact area between the rotating shaft 1 and the lip portion 2 is small and thus generates a smaller amount of worn powder in comparison with the Wilson seal mechanism. Accordingly, it can be expected to improve a processing efficiency of an object to be processed such as a substrate to be processed placed on a vacuum side. Note that, in general, since an actuator, which performs a rotating motion and the like, is longitudinally fixed, a shape of the lubricant holding member 5 need not have a structure for filling a portion between two sealants with a lubricant as in the Wilson seal mechanism shown in FIG. 5, and the lubricant holding member 5 may have a wide opening such as a dish-shaped opening.

When the lubricant holding member 5 is previously filled with an appropriate amount of the lubricant 4, since the lubricant is supplied to the lip portion 2 when necessary, lubrication is continued for a long period with a result that a vacuum seal can be continued for a long period.

An embodiment of the substrate transfer apparatus according to the present invention will be explained referring to FIG. 2, which shows an operation state of a link mechanism, and to FIG. 3 which shows a perspective view of the link mechanism.

As shown in FIGS. 2 and 3, the link mechanism of the substrate transfer apparatus of the present invention is composed of a first link mechanism 20a and a second link mechanism 20b. The first link mechanism 20a is composed of a first parallel link 21 and a third parallel link 23, and the second link mechanism 20b is composed of a second parallel link 22 and a fourth parallel link 24.

The first parallel link 21 includes a first arm 21a and a fourth arm 21b, the second parallel link 22 includes a second arm 22a and a third arm 22b, the third parallel link 23 includes a fifth arm 23a and a sixth arm 23b, and the fourth parallel link 24 includes a seventh arm 24a and an eighth arm 24b.

The first arm 21a is fixedly attached to a first drive shaft 25, the second arm 22a is fixedly attached to a second drive shaft 26, the third arm 22b is rotatably attached to the first drive shaft 25, and the fourth arm 21b is rotatably attached to the second drive shaft 26. Accordingly, each pair of arms such as a pair of the first arm 21a and the fourth arm 21b and a pair of the second arm 22a and the third arm 22b is arranged to rotate in the same direction. In this case, a means for fixedly attaching the arms and a means for rotatably attaching them are not particularly restricted, and known means such as a key and the like and a bearing and the like may be used.

A gear 27a in a gear box 27 is fixed to one end of the first arm 21a, and one end of the fifth arm 23a is pivotably coupled with the gear 27a. One end of the sixth arm 23b is fixed to a gear 27b, and one end of the fourth arm 21b is pivotably coupled with the gear 27b. A gear 28a in a gear box 28 is fixed to one end of the third arm 22b, and one end of the seventh arm 24a is pivotably coupled with the gear 28a. One end of the eighth arm 24b is fixed to a gear 28b, and one end of the second arm 22a is pivotably coupled with the gear 28b. These gears 27a, 27b, 28a, and 28b are arranged such that rotations are reversed from each other between parallel links connected by these gears, i.e., between the first parallel link and the third parallel link and between the second parallel link and the fourth parallel link. Further, a pair of arms, such as a pair of the fifth arm and sixth arm and a pair of the seventh arm and the eighth arm is arranged to rotate in the same direction.

The first drive shaft 25 and the second drive shaft 26 are disposed to pass through a shaft support base 30 which is a flange portion of a case 29 in which a drive source is disposed.

The respective parallel links including the respective arms described above are attached as described below. First, when the first parallel link 21 is attached to the first drive shaft 25 and the second drive shaft 26, the first arm 21a of the first parallel link is fixedly coupled with the first drive shaft 25 by a key and the like, and the fourth arm 21b of the first parallel link 21 is rotatably attached to the second drive shaft 26 by a member such as a bearing and the like which permits them to rotate. When the second parallel link 22 is rotatably attached to the first drive shaft 25 and the second drive shaft 26, the second arm 22a of the second parallel link 22 is fixedly coupled with the second drive shaft 26 by a key and the like, and the third arm 22b of the second parallel link 22 is attached to the first drive shaft 25 by a rotating member such as a bearing and the like which permits them to rotate.

As described above, the first parallel link 21 and the second parallel link 22 have two attachment shafts and shares them so that two arms can be attached to one attachment shaft.

Accordingly, since a number of components can be reduced, a total weight and a manufacturing cost of the substrate transfer apparatus can be reduced. Further, since the two parallel links are attached by only the two first and second drive shafts 25, 26, when this arrangement is compared with that of a transfer apparatus of a conventional technique in which two parallel links are attached by four shafts including two drive shafts and two driven shafts disposed at intervals, a pivot radius is reduced by the intervals. As a result, an apparatus capable of saving a space can be provided.

A first holding portion 31a and a second holding portion 32a are attached to extreme ends of the third parallel link 23 and the fourth parallel link 24, respectively, and a first pick-up 31b and a second pick-up 32b are attached to extreme ends of the holding portions 31a and 32a to transfer an object to be processed such as a substrate and the like.

To make an actuator for performing a rotating motion compact, it may be indispensable to dispose structural members in the actuator asymmetrically. In this structure, however, a force is not uniformly applied to the respective internal structural members when a vacuum exhaust is performed. Accordingly, since an uneven external force is applied to the inside of the actuator, there is a possibility that the internal structural members are distorted. To cope with the distortion, ordinarily, rigidity of the structural members themselves is increased and holding members are additionally attached thereto, from which a problem arises in that the actuator itself is increased in size. To protect the internal structural members in the actuator (internal structural members in the case), the present invention provides a protection member, which is attached to the outside of the actuator, with rigidity and forms many attachment contact points to the protection member so that they are in contact with the actuator side to suppress deformation such as distortion and the like of the actuator caused by an uneven force applied to the actuator by an vacuum exhaust and the like without increasing the actuator itself in size. The protection member is preferably made of a material, for example, stainless steel, iron, and the like having a large Young's modulus in a shape by which a cross section secondary moment is increased.

Next, an operation mode of the substrate transfer apparatus of the present invention will be explained referring to FIG. 4, which shows an overall structure of the substrate transfer apparatus to which the first drive shaft 25 and the second drive shaft 26 described above are attached (the first link mechanism 20a and the second link mechanism 20b are not shown in their entireties) and to FIGS. 2 and 3 described above. In FIG. 4, the same components as those of FIGS. 2 and 3 are denoted by the same reference numbers unless otherwise noted.

According to FIG. 4, which schematically shows a cross section of an overall structure of the substrate transfer apparatus of the present invention, the first drive shaft 25 and the second drive shaft 26 are disposed passing through a flange portion 41 (corresponding to the shaft support base 30 of FIGS. 2 and 3) of a case 40 (corresponding to reference numeral 29 of FIG. 3), and a first drive source 42a and a second drive source 42b such as motors and the like are disposed to lower ends of the first drive shaft and a second drive shaft, respectively in the case 40.

The first drive shaft 25 and the second drive shaft 26 are rotated by the first drive source 42a and the second drive source 42b, respectively to thereby rotate the first parallel link 21 and the second parallel link 22.

The first parallel link 21 and the second parallel link 22 are arranged such that the rotations thereof apply reverse rotations to the third parallel link 23 and the fourth parallel link 24 through gears, respectively. Accordingly, the first holding member 31a and the second holding member 32a can make a linear motion forward and backward on a linear line that connects the first drive shaft 25 to the second drive shaft 26.

As a result, the first pick-up 31b and the second pick-up 32b make a linear motion in a state that they grip a substrate so as to transfer the substrate. In this case, since the first link mechanism 20a and the second link mechanism 20b are disposed to have a different height with respect to a horizontal surface, both the link mechanisms, i.e., the first pick-up 31b and the second pick-up 32b can pass by one another without colliding with each other.

Although FIGS. 2 to 4 show an example in which the first link mechanism 20a is located above the second link mechanism 20b, it is needless to say that they may be disposed in an opposite positional relation.

At least one set of the rotation introduction mechanism S shown in FIG. 1 is disposed to the periphery of each of the first drive shaft 25 and the second drive shaft 26 so that a substrate transfer side including the first link mechanism 20a and the second link mechanism 20b is kept in a vacuum state with respect to the inside of the case 40 in which the drive sources and the like are disposed.

When the drive motor 42a, which is the first drive source, is driven, the first parallel link 21 is rotated through the first drive shaft 25. The third parallel link 23 is attached to the first parallel link 21 through the gear box 27, and the third parallel link is arranged to operate in a direction opposite to a rotating direction of the first parallel link at the same angle. Accordingly, the first holding portion 31a and the first pick-up 31b attached to an extreme end of the third parallel link 23 linearly move on a linear line that connects the first drive shaft 25 to the second drive shaft 26 forward and backward.

Likewise, when the drive motor 42b, which is the second drive source, is driven, the second parallel link 22 is rotated through the second drive shaft 26. The fourth parallel link 24 is attached to the second parallel link 22 through the gear box 28, and the fourth parallel link is arranged to operate in a direction opposite to a rotating direction of the second parallel link at the same angle. Accordingly, the second holding portion 32a and the second pick-up 32b attached to an extreme end of the fourth parallel link 24 linearly move on a linear line that connects the second drive shaft 26 to the first drive shaft 25 forward and backward.

In this case, an object to be processed such as a substrate and the like is transferred using the first pick-up 31b attached to the first holding portion 31a and the second pick-up 32b attached to the second holding portion 32a. The respective link mechanisms each including the first pick-up and the second pick-up are disposed up and down at intervals with respect to the horizontal surface.

Further, a support base 43, which includes the first drive shaft 25 and the second drive shaft 26, is coupled with a third drive motor 45 in its entirety through a first pulley 44 and a first belt 51. Accordingly, when the third drive motor 45 is driven, the first holding portion 31a and the second holding portion 32a, which are disposed to extreme ends of the third parallel link 23 and the fourth parallel link 24 connected to the first parallel link 21 and the second parallel link 22 through the gears, can be pivoted in any arbitrary direction. Since the rotation introduction mechanism S is interposed between the support base 43 and a support member 46, the vacuum state can be kept on the substrate transfer side even if the pivot operation is performed. With this arrangement, the vacuum processing apparatus, on which the substrate transfering apparatus of the present invention is mounted, can optionally change a number of processing chambers, disposition thereof, and the like. In this case, the third drive motor 45 may be directly coupled with the support base 43.

Further, the substrate transfer apparatus of the present invention is provided with a vertically moving mechanism for moving the first link mechanism 20*a* and the second link mechanism 20*b* in a vertical direction. As shown in, for example, FIG. 4, the support member 46 is coupled with a fourth drive motor 48, and a second pulley 49 and a second belt 52 through a member having a lifting/lowering function such as a ball screw 47 and the like. Since the support member 46 is lifted and lowered by driving the fourth drive motor 48, the first holding portion 31*a* and the second holding portion 32*a*, which are disposed to the respective extreme ends of the first link mechanism 20*a* and the second link mechanism 20*b*, i.e., the third parallel link 23 and the fourth parallel link 24 connected to the first parallel link 21 and the second parallel link 22, can be lifted and lowered. With this operation, the vacuum processing apparatus, on which the substrate transfer apparatus of the present invention is mounted, can optionally change the disposition thereof and the like. In this case, the fourth drive motor 48 may be directly coupled with the ball screw 47 and the like.

A stretchable member such as a bellows is interposed between the support member 46 and the flange portion 41 of the case 40 so that airtightness is kept even if a lifting/lowering operation is performed.

As shown in FIG. 4, a protection member 50, which is made of stainless steel, iron, and the like and has a large of Young's modulus, is attached to an outer periphery of the case to protect internal structural members of the case 40. The protection member is provided with many attachment contact points to the case side to suppress deformation such as distortion and the like of the internal structural members of the case caused by an uneven force applied to the actuator by a vacuum exhaust and the like without increasing the case itself in size.

According to the rotation introduction mechanism of the present invention, since a lubricant filling cycle is long and a sliding resistance between the lip portion and the rotating shaft is low, worn powder is generated in a smaller amount and a clean environment can be secured as well as a life is long and an improvement a processing efficiency of an object to be processed placed on the vacuum side can be expected. According to the substrate transfer apparatus of the present invention, since the attachment shaft of the first parallel link and the second parallel link is shared, a number of components can be reduced so that a total weight and a manufacturing cost of the substrate transfer apparatus can be reduced. Further, since the attachment shaft is shared, a pivot radius is reduced and space-saving can be achieved. As a result, objects to be processed can be sequentially and continuously loaded to and unloaded from a predetermined position of a vacuum processing chamber in one step, a working time can be reduced, a processing time of the objects to be processed can be reduced, and no foreign substance is deposited on the objects to be processed.

Accordingly, the vacuum processing apparatus provided with the substrate transfer apparatus can be effectively used in a field of a semiconductor device.

Figure 1:
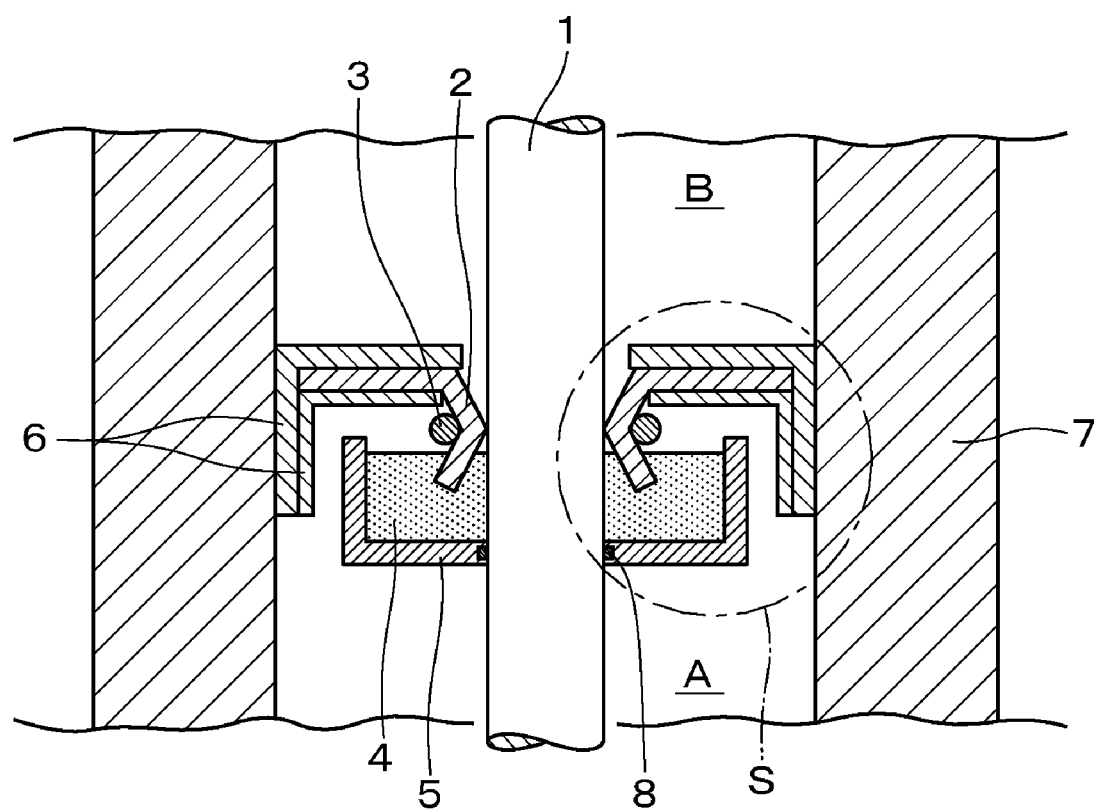
FIG. 1 is a sectional view schematically showing a first embodiment of a rotation introduction mechanism according to the present invention.
Figure 2:
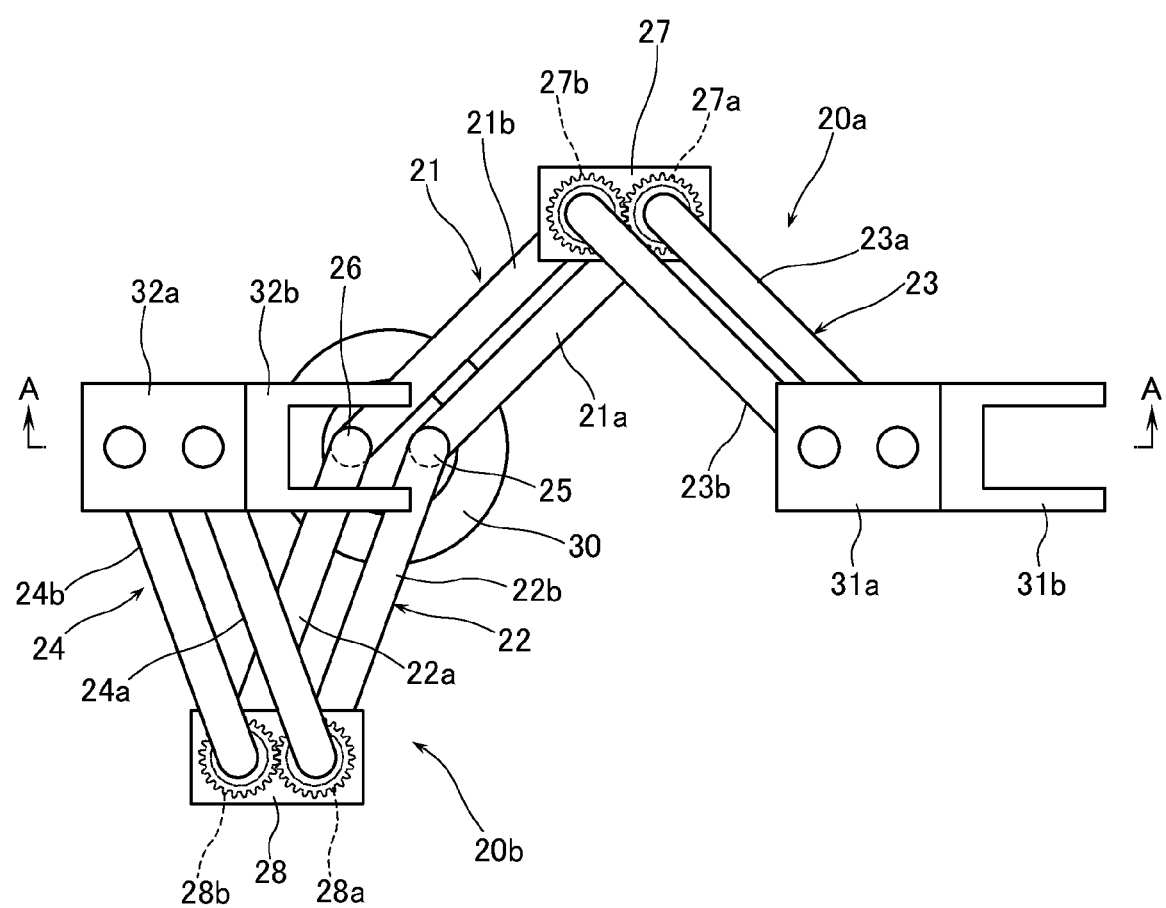
FIG. 2 is a view explaining a mechanism showing an operating state of a link mechanism in a first embodiment of a substrate transfer apparatus of the present invention.
Figure 3:
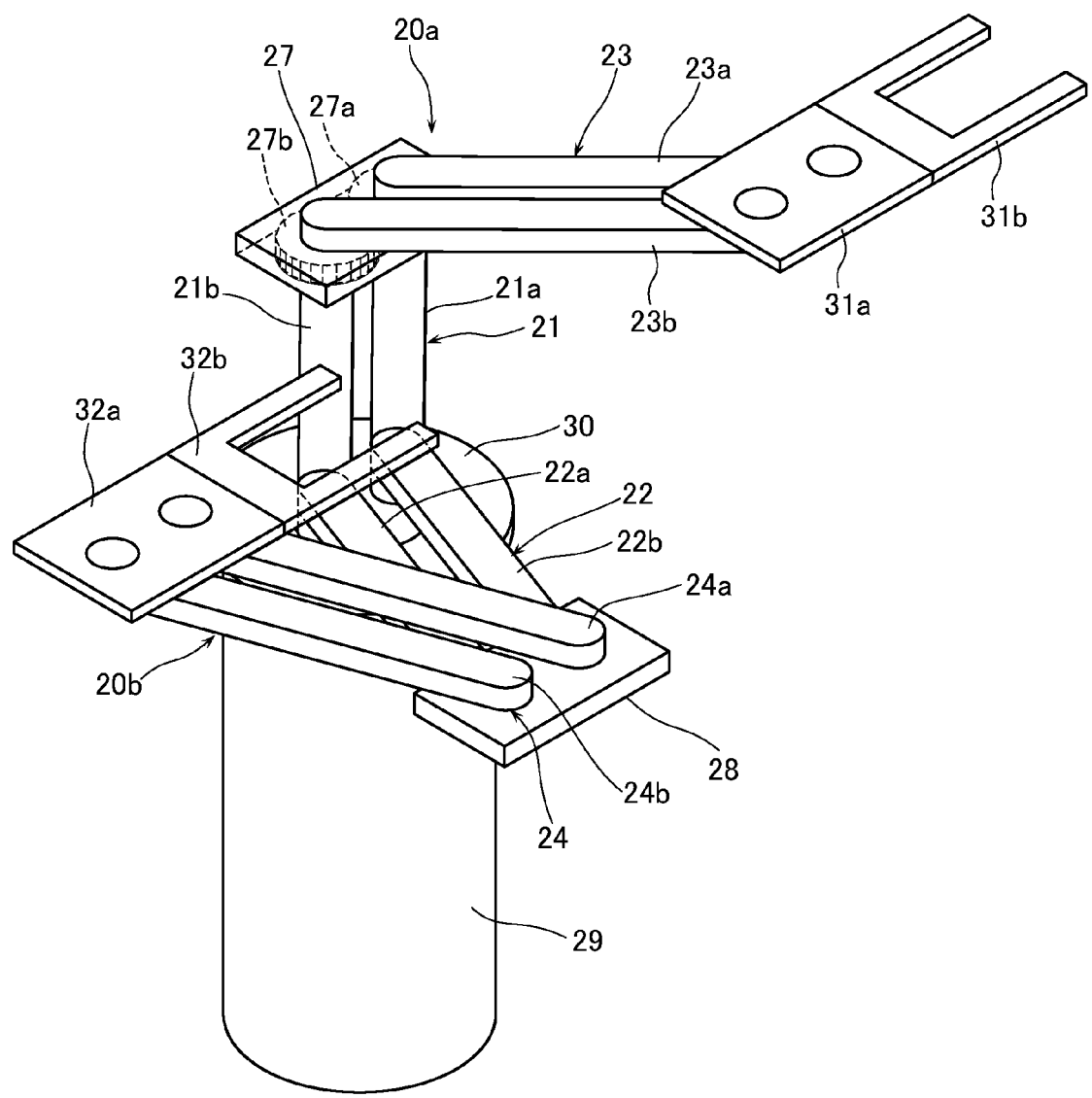
FIG. 3 is a perspective view of the link mechanism in the first embodiment of the substrate transfer apparatus according to the present invention.
Figure 4:
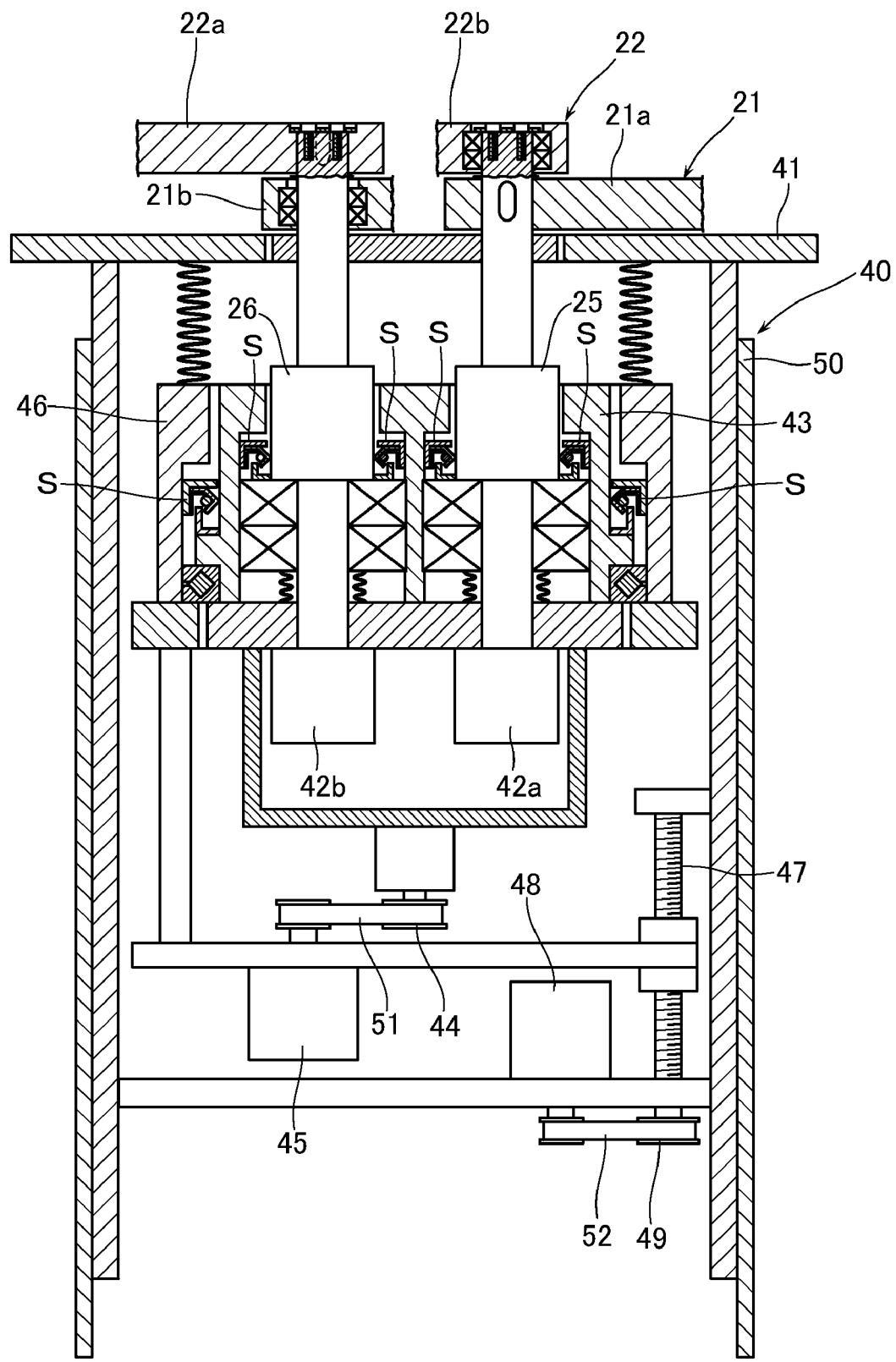
FIG. 4 is an arrangement view schematically showing an overall structure of the substrate transfer apparatus according to the present invention when viewed from A-A line of FIG. 2.
Figure 5:
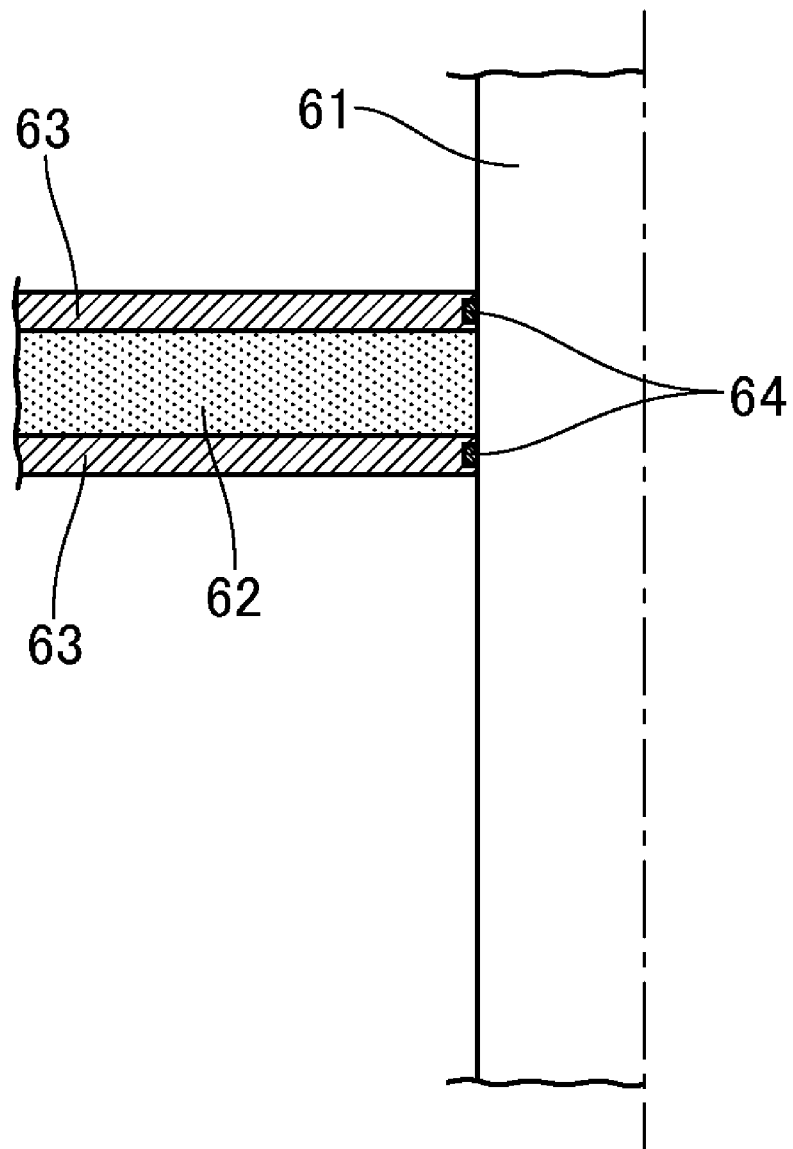
FIG. 5 is a sectional view schematically showing a mode of a Wilson seal.

DESCRIPTION OF REFERENCE NUMERALS 1 drive shaft (rotating shaft)
2 lip portion
3 presser member
4 lubricant
5 lubricant holding member
6 fixing member
7 housing
S rotation introduction mechanism
20*a* first link mechanism
20*b* second link mechanism
21 first parallel link
21*a* first arm
21*b* fourth arm
22 second parallel link
22*a* second arm
22*b* third arm
23 third parallel link
23*a* fifth arm
23*b* sixth arm
24 fourth parallel link
24*a* seventh arm
24*b* eighth arm
25 first drive shaft
26 second drive shaft
27, 28 gear box
27*a*, 27*b*, 28*a*, 28 gear
29 case
30 shaft support base
31*a* first holding portion
31*b* first pick-up
32*a* second holding portion
32*b* second pick-up
40 case
41 flange portion
42 first drive source
42*b* second drive source
43 support base
44 first pulley
45 third drive motor
46 support member
47 ball screw
48 fourth drive motor
49 second pulley
50 protection member
51 first belt
52 second belt

What is claimed is:
1. A substrate transfer apparatus comprising:
a first drive shaft and a second drive shaft respectively driven by a drive source installed on atmosphere side;
a first link mechanism including a first arm and a fourth arm;

a second link mechanism including a second arm and a third arm; and a vacuum seal mechanism including,
- a lip portion coming into line contact with each of the drive shafts,
- a presser member for pressing the lip portion to each of the rotating shafts, and
- a lubricant holding member for holding lubricant to be supplied to the lip portion, wherein the first arm is fixedly attached to the first drive shaft,
- the second arm is fixedly attached to the second drive shaft,
- the third arm is rotatably attached to the first drive shaft and shares the first drive shaft with the first arm, and
- the fourth arm is rotatably attached to the second drive shaft and shares the second drive shaft with the second arm.

2. The substrate transfer apparatus according to claim 1, wherein
- the first link mechanism includes a first parallel link and a third parallel link,
- the second link mechanism includes a second parallel link and a fourth parallel link,
- the first parallel link includes the first arm and the fourth arm, and
- the second parallel link includes the second arm and the third arm.

3. The substrate transfer apparatus according to claim 1, further comprising:
- a case for accommodating a drive source; and
- a protection member, attached to an outer periphery of the case, for protecting internal structural members of the case, the internal structural members being disposed asymmetrically to a center axis of the case.

4. The substrate transfer apparatus according to claim 1 further comprising a vertically moving mechanism for moving the first link mechanism and the second link mechanism in a vertical direction.

5. A substrate transfer apparatus comprising:
- a first link mechanism including a first parallel link and a third parallel link;
- a second link mechanism including a second parallel link and a fourth parallel link, wherein
  - the first parallel link has a first arm and a fourth arm,
  - the second parallel link has a second arm and a third arm,
  - the first arm is fixedly attached to a first drive shaft,
  - the second arm is fixedly attached to a second drive shaft,
  - the third arm is rotatably attached to the first drive shaft and shares the first drive shaft with the first arm,
  - the fourth arm is rotatably attached to the second drive shaft and shares the second drive shaft with the second arm, and
- wherein rotation of the first parallel link rotated by the first drive shaft is transmitted to the third parallel link through a gear to thereby rotate the third parallel link in a direction reverse to that of the first parallel link;
- a first substrate holding portion disposed to an extreme end of the third parallel link movable linearly on a linear line that connects the first drive shaft to the second drive shaft,
- wherein rotation of the second parallel link rotated by the second drive shaft is transmitted to the fourth parallel link through a gear to thereby rotate the fourth parallel link in a direction reverse to that of the second parallel link; and
- a second substrate holding portion disposed to an extreme end of the fourth parallel link movable linearly on a linear line that connects the first drive shaft to the second drive shaft.

6. The substrate transfer apparatus according to claim 5, further comprising:
- a case for accommodating therein a drive source which rotatably drives the first drive shaft and the second drive shaft; and
- a protection member, attached to an outer periphery of the case, for protecting
- internal structural members disposed asymmetrically to a center axis of the case.

7. The substrate transfer apparatus according to claim 5 further comprising a vertically moving mechanism for moving the first link mechanism and the second link mechanism in a vertical direction.

8. The substrate transfer apparatus according to claim 5, further comprising
- a vacuum seal mechanism including a lip portion coming into line contact with each of the drive shafts,
- a presser member for pressing the lip portion to each of the drive shafts, and
- a lubricant holding member for holding the lubricant to be supplied to the lip portion.

9. The rotation introduction mechanism according to claim 8, wherein the lip portion is in direct contact with the rotating shaft.

10. The rotation introduction mechanism according to claim 8, wherein the lubricant holding member has an opening and the lubricant is exposed.

11. The rotation introduction mechanism according to claim 1, wherein the lip portion is in direct contact with the rotating shaft.

12. The rotation introduction mechanism according to claim 1, wherein the lubricant holding member has an opening and the lubricant is exposed.

13. A vacuum processing apparatus comprising:
- a transfer chamber having the substrate transfer apparatus according to claim 1; and
- at least one vacuum processing chamber coupled to the transfer chamber and arranged to transfer an object to be processed using the substrate transfer apparatus.

* * * * *